(12) United States Patent  
Schlotterbeck et al.

(10) Patent No.: US 7,311,559 B1  
(45) Date of Patent: Dec. 25, 2007

(54) TERMINAL STRIP CONTACTING ADAPTER

(75) Inventors: Lyal K. Schlotterbeck, Renton, WA (US); Kenneth B. Pavletich, Renton, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 11/533,123

(22) Filed: Sep. 19, 2006

(51) Int. Cl.
*H01R 13/24* (2006.01)

(52) U.S. Cl. ..................................... 439/700

(58) Field of Classification Search ............... 439/700, 439/824
See application file for complete search history.

(56) References Cited

U.S. PATENT DOCUMENTS 6,454,608 B1 * 9/2002 Kitahara et al. ............ 439/638

* cited by examiner

*Primary Examiner*—Ross Gushi
(74) *Attorney, Agent, or Firm*—Don C. Lawrence; MacPherson Kwok Chen & Heid LLP

(57) ABSTRACT

An adapter enables an automated tester to make electrical contact with a plurality of terminal posts of a terminal strip of an aircraft's electrical power system simultaneously, and includes a housing, a plurality of spring-loaded contactors protruding through a floor of the housing, and a printed circuit board disposed within the housing. Conductive leads respectively couple inner ends of the contactors to conductive traces of the printed circuit board. A wiring harness having a connector at one end is coupled to the circuit board such that each of its wires is coupled to a respective contactor via a circuit trace. Fuses are mounted on the circuit board and electrically coupled between the contactors and the harness wires. The adapter detachably couples to the terminal strip such that an outer end of each of the contactors is held in biased contact with a corresponding one of the terminal posts.

26 Claims, 6 Drawing Sheets

TERMINAL STRIP CONTACTING ADAPTER

BACKGROUND

Modern commercial, military and general aviation aircraft typically include complex electrical power systems that require extensive testing, both during manufacture and subsequent maintenance thereof. As a consequence, automated testing equipment is typically designed and developed along with the electrical power system of the aircraft that enables, e.g., power on testing of the system to be effected in a relatively fast, safe and reliable manner.

Such tests are typically conducted by equipping the automated test equipment with a test probe and then manually probing the individual terminal posts of several of the terminal strips of the aircraft's circuit breaker panels, i.e., the elongated rows of electrical terminals disposed in line with each other in the panels, to which the ends of the wires of the electrical system are coupled together with, e.g., spade lugs or other types of wire connectors.

For example, in the Boeing 737 aircraft, the electrical power system includes two circuit breaker panels, respectively including four and five terminals strips, each of which may include from between two to as many as ten or more terminal posts. Thus, in previous power on testing methods, even though automated test equipment was available, a technician was still required to contact several terminal posts with a voltage probe individually, i.e., one terminal post at a time, and repeatedly, e.g., both with and without power present at the terminal, to ensure that the action performed between the two checks actually caused the change in the power state of the terminal. Accordingly, this method is relatively labor intensive, and because the technician is required to probe many terminal posts and repeatedly during the course of one test sequence, the possibility of errors is increased. Additionally, because the circuit breaker panels must be open to accomplish the voltage measurements, the previous method exposes the personnel conducting the testing to some hazards. These problems can be even more exacerbated in larger, more complex aircraft.

BRIEF SUMMARY

In accordance with the present invention, an adapter is provided for conducting automated power on tests of an aircraft's electrical power system that enables an electrical connection between the testing equipment and the relevant terminal posts of the aircraft's electrical power system to be made simultaneously, thereby overcoming the above and other problems of the prior art.

In one particular exemplary embodiment, the novel adapter comprises an elongated housing having a cover and a recessed floor. The housing and cover are made of an electrically insulating material having a high dielectric strength, e.g., phenolic. A plurality of "pogo pins," equal in number to the number of terminal posts on the terminal strip to which the adapter is intended to interface, protrude through the floor of the housing. Each of the pins includes an electrically conductive contactor having a first end disposed within the recess of the housing, an opposite second end disposed outside of the housing, and a spring that biases the contactor outwardly from the housing. In one particular exemplary embodiment, the pogo pins are installed in apertures of the floor of the housing with a press fit, and the second end of the contactors may have a hemispherical shape.

A printed circuit board (PCB) having a plurality of electrically conductive traces is disposed in the recess of the housing. In one particular exemplary embodiment, the first or inner ends of the pogo pins extend through apertures in the PCB, and a plurality of electrically conductive "pig tails" or leads couple the inner ends of respective ones of the contactors to a corresponding one of the conductive traces of the PCB.

A wiring harness is coupled to one end of the housing. The wiring harness comprises a plurality of electrically conductive wires, each having opposite first and second ends, each second end being electrically coupled to the first or inner end of a corresponding one of the pogo pin contactors via a corresponding one of the circuit traces of the printed circuit board. An electrical connector is disposed at a first end of the wiring harness for connecting the adapter to an automated testing apparatus, either directly, or indirectly, through an "interface box" that enables a number of adapters to be coupled to the same testing apparatus through a single connector. The adapter connector includes a plurality of electrical contacts, each electrically coupled to a first end of a corresponding one of the wires of the wiring harness.

A plurality of safety fuses is mounted on the PCB. Each of the fuses is electrically coupled between a corresponding one of the pogo pin contactors and the second end of a corresponding one of the wires of the wire harness. The fuses augment the circuit breakers of the panel during testing, and act to shield both the automated testing apparatus and the test personnel from potentially dangerous currents that may be present on the terminal posts, and enable the use of smaller wire gauges in the adapter, and hence, a smaller adapter.

The adapter also includes a simple attachment mechanism for detachably coupling the housing to the terminal strip such that the second or outer end of each of the pogo pin contactors is held in biased contact with a corresponding one of the terminal posts.

A exemplary embodiment of a method for electrically coupling an automated testing apparatus to all of the terminal posts of a terminal strip of an aircraft's electrical system simultaneously using the exemplary adapter comprises coupling the housing of the adapter to the terminal strip with the coupling mechanism such that the outer end of each of the pogo pin contactors is held in biased contact with a corresponding one of the terminal posts of the terminal strip, and then electrically coupling a distal end of the wires of the wiring harness to the automated testing apparatus with the connector of the adapter. As above, this coupling with the testing apparatus may be effected directly, or indirectly through an intermediate interface box.

The adapter enables the time needed to conduct a power on test of an aircraft's electrical power system to be substantially reduced, increases the reliability of the test, and provides enhanced safety for the testing equipment and personnel.

A better understanding of the above and many other features and advantages of the testing adapter of the present invention may be obtained from a consideration of the detailed description of some exemplary embodiments thereof below, particularly if such consideration is made in conjunction with the appended drawings, wherein like reference numerals are used to identify like elements illustrated in one or more of the figures thereof.

DETAILED DESCRIPTION

Figure 1:
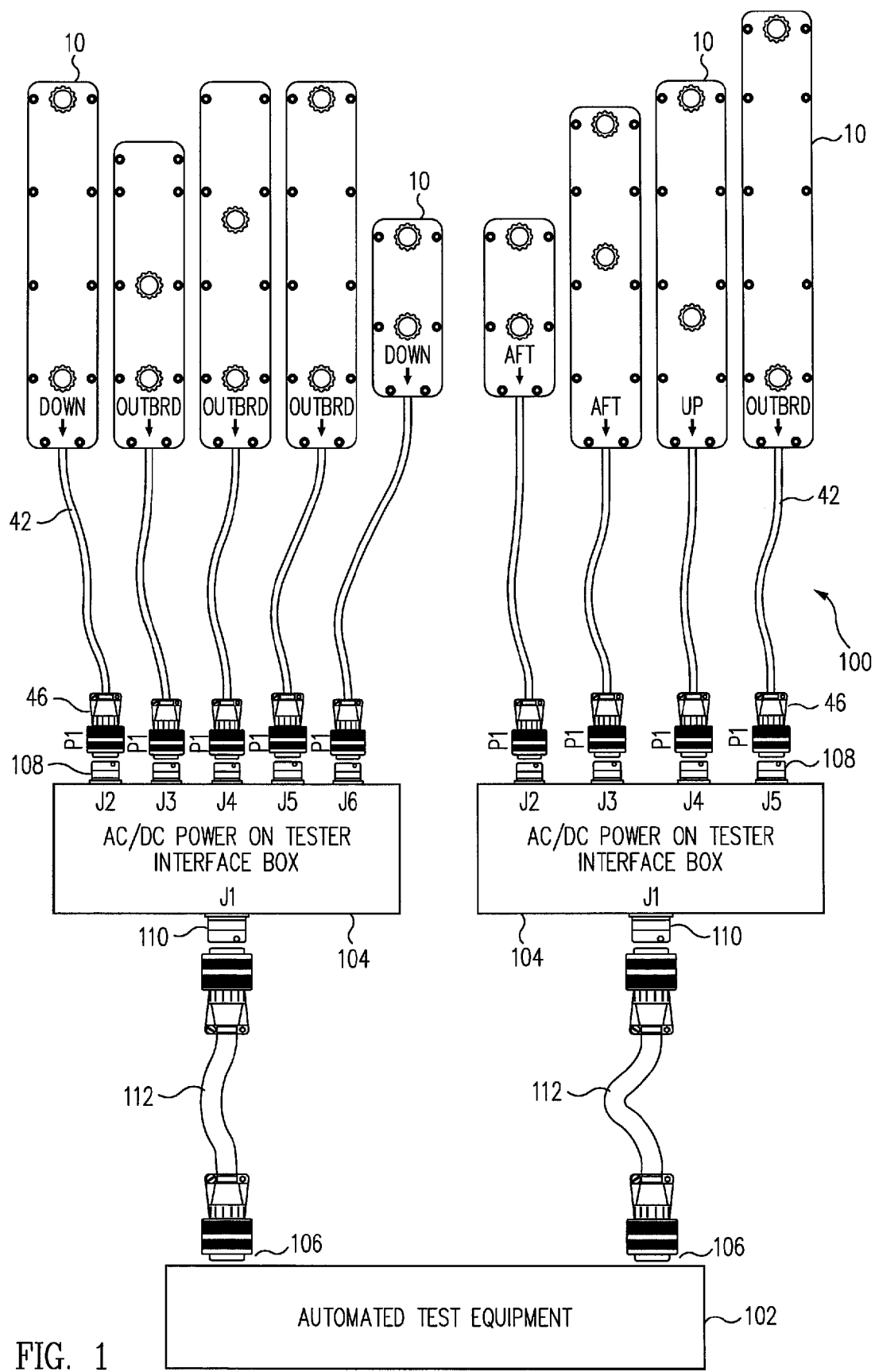
FIG. 1 is a top plan view of a system for performing a power on test of the electrical power system of an aircraft and incorporating a plurality of exemplary embodiments of terminal strip contacting adapters in accordance with the present invention.

FIG. 1 is a top plan view of a system 100 for performing an automated power on test of the electrical power system of an aircraft, and which incorporates a plurality of exemplary embodiments of terminal strip contacting adapters 10 in accordance with the present invention. In addition to the terminal strip contacting adapters, the test system also comprises an automated testing apparatus 102 and a plurality of tester interface boxes 104.

As discussed above, the automated testing apparatus 102 is typically designed along with, and hence, in accordance with the circuit parameters that are specific to the particular electrical power system that it is designed to test. In the particular exemplary embodiment illustrated in FIG. 1, the testing apparatus 102 includes two input/output (I/O) connectors 106, each adapted to receive and output electrical test signals from respective ones of two circuit breaker panels (not illustrated) of the aircraft. Each panel, in turn, contains several terminals strips, with five and four terminal strips, respectively being tested in the particular exemplary embodiment shown. Each of the terminal strips is populated with a number of terminal posts, which can range in number from between two and up to 10 or even more, terminal posts, several of which eventually must be coupled to the testing apparatus 102 during a typical power on testing sequence.

As discussed above, in previous power on testing methods, the circuit breaker panels of the aircraft were opened, and several of the terminal posts in the panels were then individually probed with a probe coupled to the automated testing apparatus 102, some numerous times. However, it has been discovered that, by providing the test system 100 with a number of the terminal strip contacting adapters 10 of the present invention, a large number of the relevant terminal posts of the terminal strips can be electrically coupled to the testing apparatus 102 simultaneously, and before the test sequence is begun, rather than individually and during the test sequence.

Figure 9A:
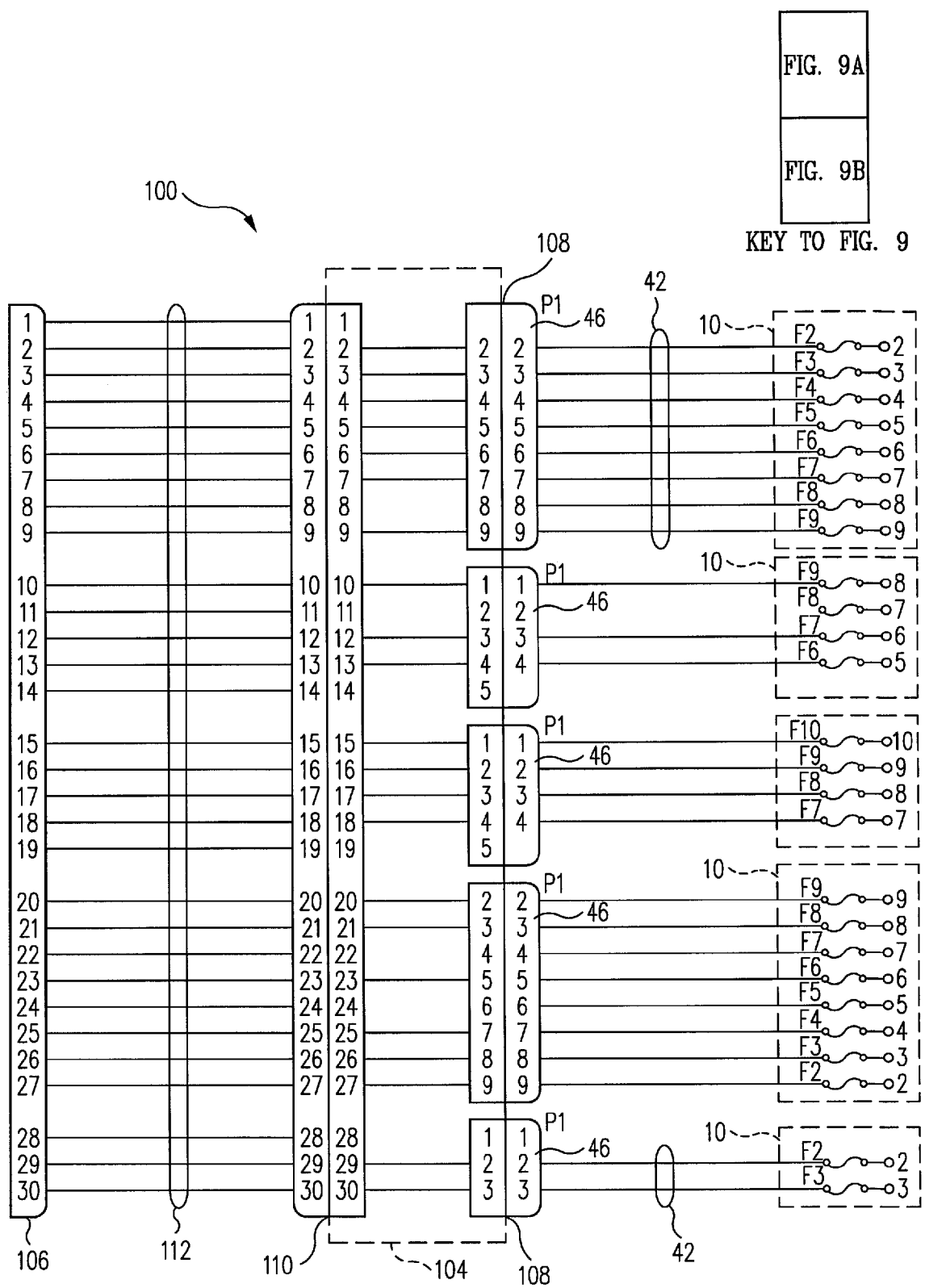
Figure 9B:
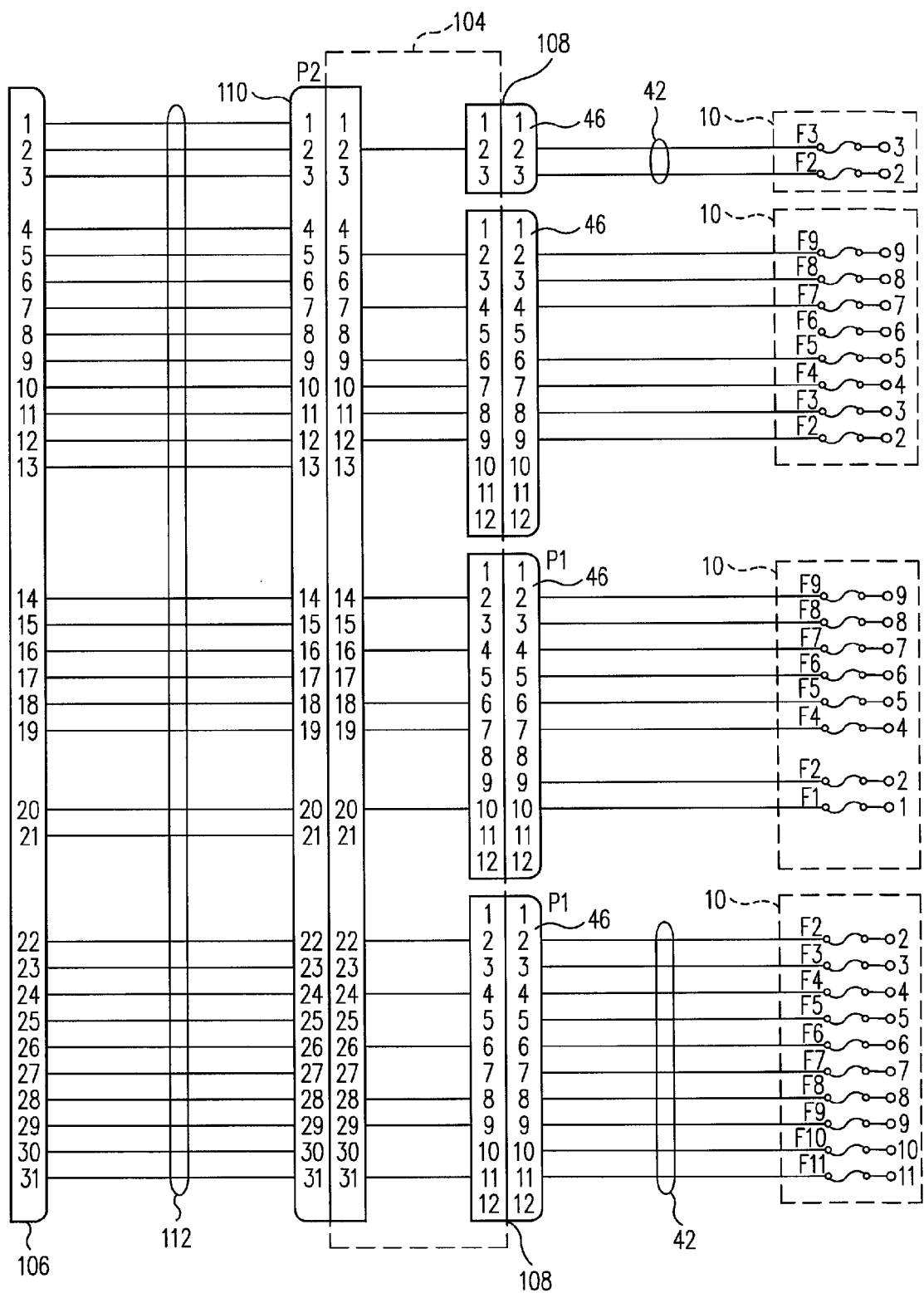

Since, as described below, each adapter 10 includes its own wiring harness 42 and connector 46, in order to reduce the number of connectors 106 on the testing apparatus 102, a number of the power interface tester boxes can be provided that is equal to the number of breaker panels to which the testing apparatus is required to interface. As illustrated in FIG. 1, each tester interface box includes a plurality of connectors 108 that is equal to the number of terminal strip contacting adapters 10 that connect thereto, for electrically coupling the electrical signals to and from the respective adapters, and hence, to and from the individual terminal posts respectively contacted thereby, and a single connector 110 for coupling those electrical signals to and from the testing apparatus 102 via an associated pair of wiring harnesses 112. Thus, as may be seen by reference to FIG. 9, which is a schematic diagram of the electrical interconnections between the exemplary terminal strip connecting adapters 10 and the automated test equipment 102, the tester interface boxes 104 function as simple "pass-through" devices whose main function is simply to interface the terminal strip contacting adapters 10 with the testing apparatus 102.

Figure 2:
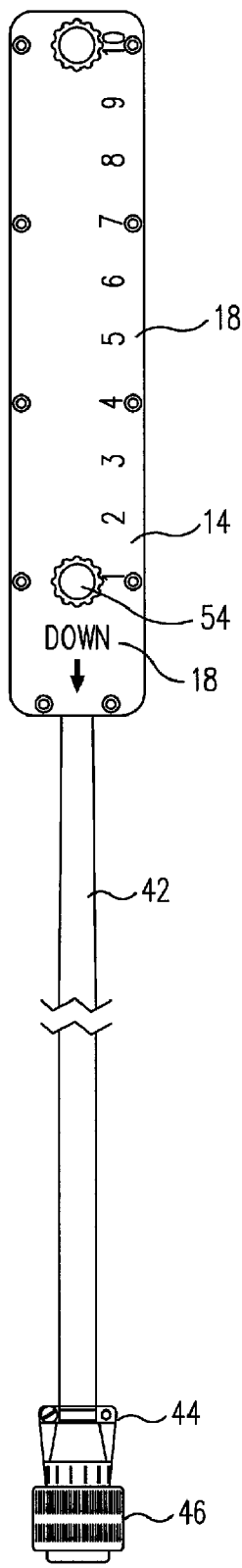
FIG. 2 is a top plan view of an exemplary embodiment of one of the terminal strip contacting adapters of FIG. 1.
Figure 3:
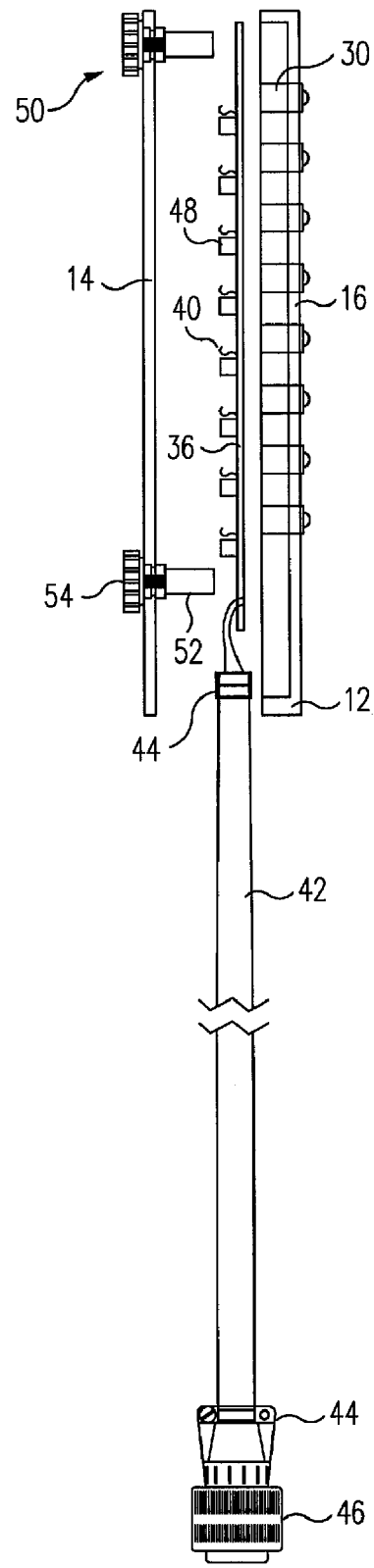
FIG. 3 is an exploded side elevation view, partially in cross-section, of the exemplary adapter of FIG. 2, showing a cover and printed circuit board of the adapter disposed above a housing thereof.
Figure 4:
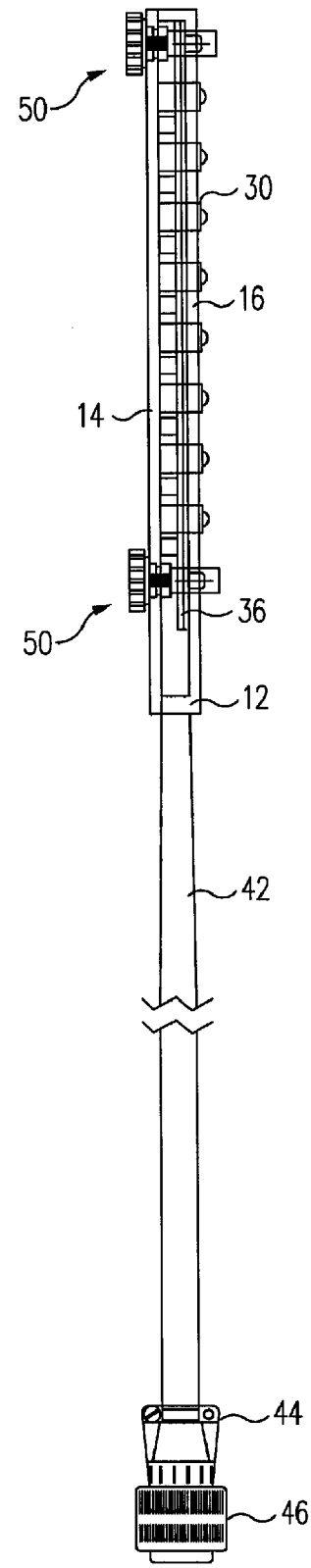
FIG. 4 is a side elevation view, partially in cross-section, of the exemplary adapter, showing the adapter in an assembled state.
Figure 5:
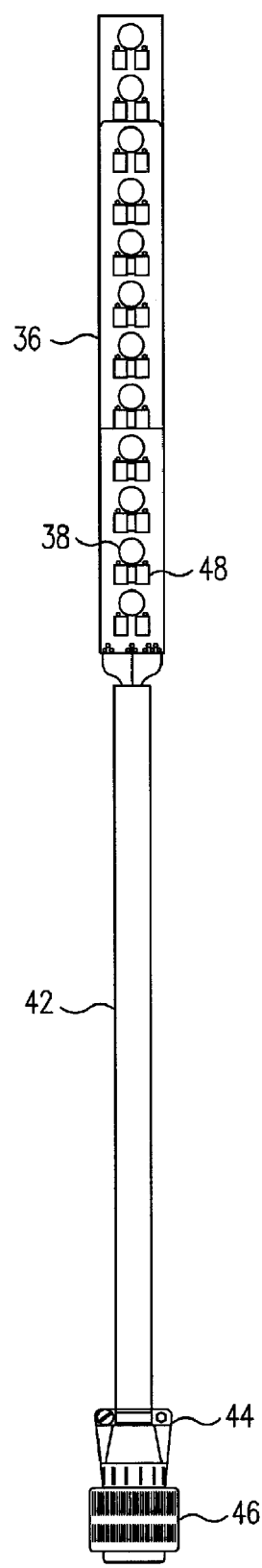
FIG. 5 is a top plan view of the printed circuit board, wiring harness and connector of the adapter.

FIG. 2 is a top plan view of an exemplary embodiment of a terminal strip contacting adapter 10 in accordance with the present invention. FIG. 3 is an exploded side elevation view, partially in cross-section, of the exemplary adapter, and FIG. 4 is a side elevation view, partially in cross-section, thereof. As may be seen by reference to these figures, the adapter 10 comprises an elongated housing 12 having a cover 14 and a recessed bottom surface or floor 16.

Figure 7A:
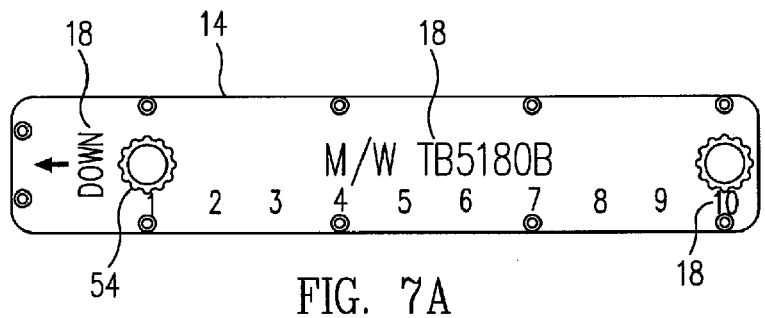
FIGS. 7A-7C are top plan, bottom plan and side elevation views, respectively, of the cover of the exemplary adapter.
Figure 7B:
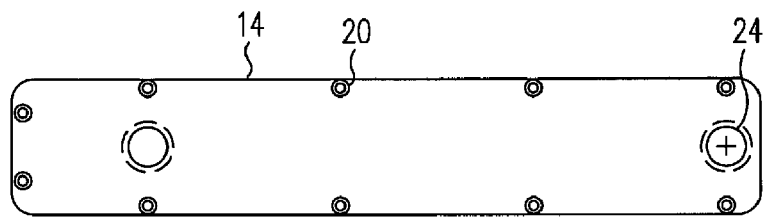
Figure 7C:
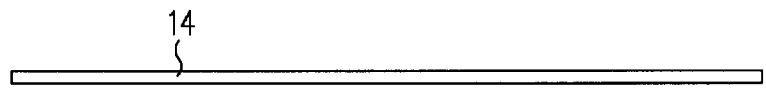
Figure 8A:
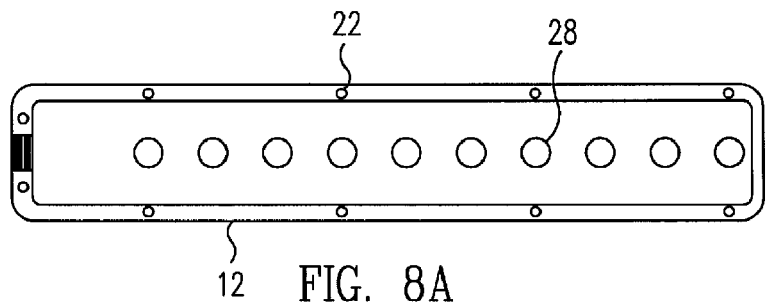
FIGS. 8A-8D are top plan, harness end, side elevation and bottom plan views, respectively, of the housing of the exemplary adapter; and, FIG. 9 is a schematic diagram of electrical interconnections between the exemplary adapters and the automated test equipment of the system of FIG. 1.
Figure 8B:
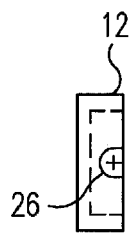
Figure 8C:
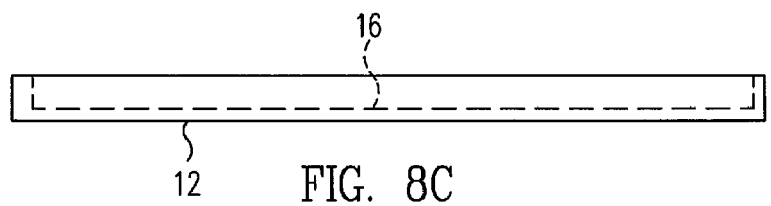
Figure 8D:
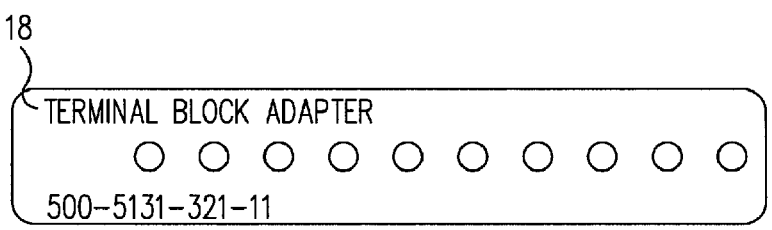

FIGS. 7A-7C are top plan, bottom plan and side elevation views, respectively, of the cover 14 of the exemplary adapter 10, and FIGS. 8A-8D are top plan, harness end, side elevation and bottom plan views, respectively, of the housing 12 thereof. The housing and cover are made of an electrically insulating material having a high dielectric strength, preferably phenolic, so that the housing and cover provide a strong resistance to high voltages that may be present on the terminal posts of the circuit breaker panels of the aircraft.

As illustrated in FIGS. 7A-7C and 8A-8D, both the housing 12 and cover 14 can be provided with suitable markings, or other readily visible and indelible indicia 18 (FIGS. 7A and 8D), that indicate to the testing personnel the particular breaker panel, terminal strip and terminal post(s) with which the adapter 10 is intended to interface. In one exemplary embodiment, the cover can be held on the housing by threaded fasteners (not illustrated) that pass through openings 20 in the periphery of the cover (FIG. 7B) and engage in corresponding threaded inserts 22 (FIG. 8A) in the side walls of the housing. The cover can also be provided with a pair of openings 24 (FIG. 7B, which are used to captivate a pair of fasteners 52 that are used to couple the adapter to the terminal strip, as described in more detail below.

The housing 12 includes an opening 26 (FIG. 8B) at one end thereof, through which a wiring harness 42 passes, and a plurality of apertures 28 (FIG. 8A) are contained in the floor 16 of the housing, through which the above fasteners 52 and a plurality of "pogo pins" 30 respectively depend, as described in more detail below.

Figure 6:
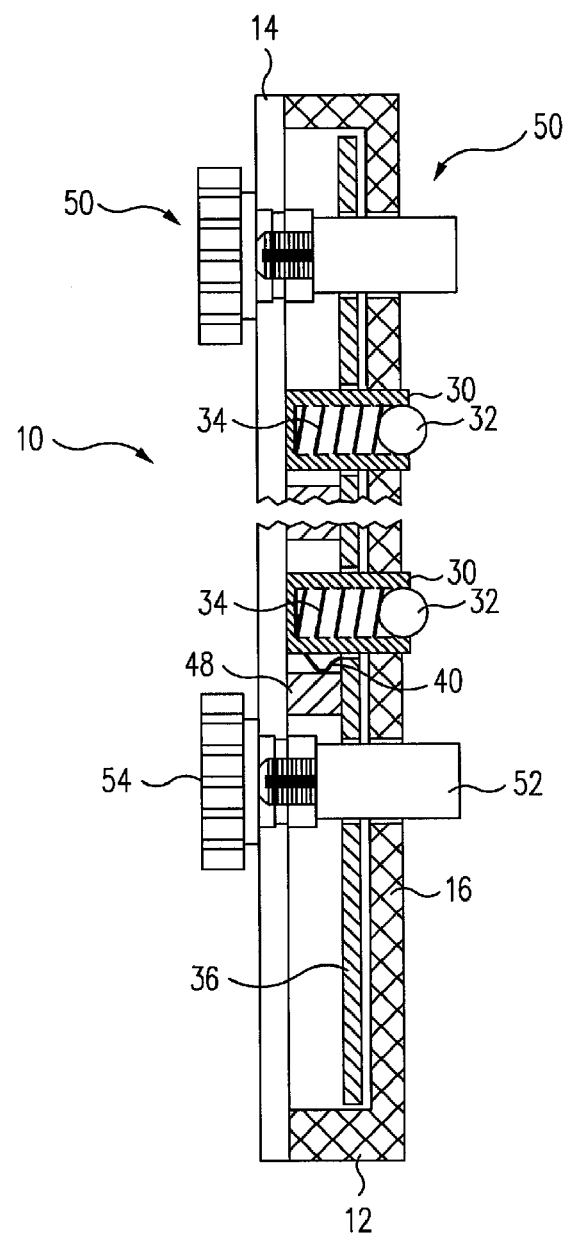
FIG. 6 is an enlarged partial cross-sectional view of the adapter, showing the printed circuit board, housing, cover, fuses, pogo pins and a coupling mechanism of the adapter.

Referring back to FIGS. 2-4, the exemplary adapter 10 further comprises a plurality of pogo pins 30 that protrude through the floor or bottom surface 16 of the housing 12. The number of the pogo pins is equal to the number of terminal posts of the terminal strip to which the adapter is intended to interface. As illustrated in the enlarged partial cross-sectional view of the adapter 10 of FIG. 6, each of the pogo pins 30 includes an electrically conductive contactor 32 having a first end disposed within the recess of the housing, an opposite second end disposed below and outside of the housing, and a spring 34 that biases the contactor outwardly from the housing. In one particular exemplary embodiment, the pogo pins are installed in the apertures 28 of the floor 16 of the housing with a press fit, and the second, or terminal post contacting end of the contactors can be provided with a hemispherical shape, as shown in FIG. 6, for making contact with an upper end of a corresponding terminal post of the terminal strip (not illustrated) to which the adapter 10 is coupled.

As illustrated in FIGS. 3-6, the exemplary adapter includes a printed circuit board (PCB) 36 having a plurality of electrically conductive traces disposed in the recess of the housing 12. In one particular exemplary embodiment, the first or inner ends of the pogo pins 30 extend through apertures 38 (see FIG. 5) in the PCB, and a plurality of electrically conductive "pig tails" or leads 40 (see FIGS. 3 and 6) are used to couple the inner ends of respective ones of the spring biased contactors 32 to a corresponding one of the conductive traces of the PCB.

A wiring harness 42 is coupled to one end of the housing. The wiring harness comprises a plurality of electrically conductive wires, each having opposite first and second ends, each second end being electrically coupled to the first, or inner end, of a corresponding one of the pogo pin contactors 32 via a corresponding one of the circuit traces of the printed circuit board 36. In the particular embodiment illustrated in the figures, the wires of the wiring harness pass through the opening 26 of the housing 12 (FIG. 8B), and may be secured to the housing by a conventional strain relief mechanism 44 (FIG. 3). An electrical connector 46 is disposed at a first end of the wiring harness for connecting the adapter to the automated testing apparatus 102 directly, or as discussed above, indirectly through one of the interface boxes 104 of FIG. 1, that enable a number of the adapters to be coupled to the testing apparatus through a single connector 110. The adapter connector 46 includes a plurality of electrical contacts, each of which is electrically coupled to a first end of a corresponding one of the wires of the wiring harness 42.

To provide additional protection to that provided by the circuit breakers of the electrical panel, which are typically sized to protect airplane wiring and systems and not the attached external test equipment or test personnel, the exemplary adapter 10 also includes a plurality of safety fuses 48 (FIGS. 3 and 6) that mount on the PCB 36 and are electrically coupled to the conductive traces thereof such that each of the fuses is electrically coupled between a corresponding one of the contactors 30 and the second or outer end of a corresponding one of the wires of the wire harness 42. Thus, a fuse 48 that is sized to interrupt the flow of a substantially smaller current than that interrupted by the circuit breakers of the aircraft's electrical system is disposed in series between each of the terminals of the terminal strip to which the adapter is mounted and the associated pin or socket of the adapter's electrical connector 46, thereby limiting the potential currents reaching the test equipment and test personnel to a much lower level and enabling the use of smaller wire gauges in the adapter, which reduces the adapter size.

The exemplary adapter 10 also includes a simple attachment mechanism 50 for detachably coupling the housing 12 to a terminal strip such that the second or outer end of each of the pogo pin contactors 30 is held in biased contact with a corresponding one of the terminal posts thereof. In the particular exemplary embodiment illustrated in the figures, the attachment mechanism comprises a pair of threaded sleeves 52 that are rotatably captivated in respective ones of the openings 24 of the cover 14 (FIG. 7B) and extend through respective ones of the apertures 28 in the floor 16 of the housing 12 (FIG. 8A) to engage threaded terminal posts (not illustrated) on opposite ends of the terminal strip to which the adapter is coupled. In the particular embodiment illustrated in the figures, the attachment mechanism 50 also comprises an insulating knob 54 disposed on respective upper ends of the threaded mounting sleeves 52, which can be used by the test personnel to quickly couple and decouple the adapter to and from the relevant terminal strip. Additionally, should it be desirable to make a test connection to either or both of the terminal posts that the respective attachment mechanisms engage, a wiping contact (not illustrated) can be mounted on the PCB 36 adjacent to either or both of the threaded sleeves 52 of the attachment mechanisms that electrically couples the sleeves to a trace on the PCB, and thence, via one of the wires of the wiring harness 42, to the test equipment 102.

As will be evident to those of some skill in this art, the exemplary adapter 10 of the pre-sent invention is particularly adapted to being made advantageously short in height. Indeed, in some aircraft, this height limitation can be very critical, due to physical constraints in the aircraft, and in some cases is limited to a maximum height of about one inch or less. Accordingly, in one preferred exemplary embodiment thereof, the maximum height of the adapter, including that of the novel pogo pins 30 thereof, is limited to about one inch or less.

By now, those of skill in this art will appreciate that many modifications, substitutions and variations can be made in and to the methods and apparatus of the terminal strip test contacting adapter of the present invention without departing from its spirit and scope. For example, the number of circuit breaker panels, the number of terminal strips in each panel, and the number of terminal posts in each of the terminal strips can vary widely, depending on the particular aircraft being tested. In light of this, the scope of the present invention should not be limited to that of the particular embodiments illustrated and described herein, as they are only exemplary in nature, but instead, should be fully commensurate with that of the claims appended hereafter and their functional equivalents.

What is claimed is:

1. An adapter for making simultaneous electrical contact with a plurality of terminal posts of a terminal strip, comprising:
   a housing;
   a removable cover on the housing;
   a plurality of pogo pins protruding through a surface of the housing, each including:
      an electrically conductive contactor having an inner end disposed inside of the housing and an outer end disposed outside thereof; and,
      a spring biasing the contactor outwardly from the housing;
   a wiring harness having a plurality of conductive wires, each having a proximal end electrically coupled to the inner end of a corresponding one of the contactors; and, a mechanism for detachably coupling the housing to the terminal strip such that the outer end of each of the pogo pin contactors is held in biased contact with a corresponding one of the terminal posts of the terminal strip, the coupling mechanism comprising:
a fastener rotatable captivated on the cover and adapted to mate with a complementary fastener of the terminal strip; and,
a knob on the fastener.

2. The adapter of claim 1 wherein each of the pogo pins has a length that is less than or equal to about one inch.

3. A method for electrically coupling a testing apparatus to the terminals of a terminal strip, the method comprising:
coupling the adapter of claim 1 to the terminal strip such that the outer end of each of the pogo pin contactors is held in biased contact with a corresponding one of the terminal posts of the terminal strip; and,
electrically coupling a distal end of the wires of the wiring harness to the testing apparatus.

4. The adapter of claim 1, wherein at least one of the housing, the cover or the housing and the cover is made of an electrically insulating material.

5. The adapter of claim 4, wherein the insulating material comprises phenolic.

6. The adapter of claim 1, further comprising a plurality of fuses, each electrically coupled between the inner end of a corresponding one of the contactors and the proximal end of a corresponding one of the harness wires.

7. The adapter of claim 6, further comprising:
a printed circuit board disposed within the housing, the printed circuit board including a plurality of electrically conductive traces; and,
a plurality of electrically conductive pigtails, each coupling the inner end of a corresponding one of the contactors to a corresponding one of the conductive traces, wherein
the proximal end of each of the wires of the wiring harness is electrically coupled to a corresponding one of the conductive traces, and
each of the fuses is electrically coupled between a corresponding pair of the conductive traces.

8. The adapter of claim 7, further comprising an electrical connector disposed at a distal end of the wiring harness, the connector including a plurality of electrical contacts, each electrically coupled to a distal end of a corresponding one of the wires of the wiring harness.

9. An apparatus for conducting an automated power on test of an electrical power system of an aircraft, comprising:
an automated power on testing apparatus;
a power on testing interface box electrically coupled to the testing apparatus; and,
an adapter for making simultaneous electrical contact with a plurality of terminal posts of a terminal strip of the aircraft's electrical power system, the adapter comprising:
an elongated housing having a cover and a recessed floor;
a plurality of pogo pins protruding through the floor of the housing, each including an electrically conductive contactor having a first end disposed within the recess of the housing, an opposite second end disposed outside of the housing, and a spring biasing the contactor outwardly from the housing;
a printed circuit board disposed within the recess of the housing, the printed circuit board including a plurality of electrically conductive traces;
a plurality of electrically conductive pigtails, each coupling the first end of a corresponding one of the pogo pin contactors to a corresponding one of the conductive traces;
a mechanism for detachably coupling the housing to the terminal strip such that the second end of each of the pogo pin contactors is held in biased contact with a corresponding one of the terminal posts; and,
a wiring harness comprising a plurality of electrically conductive wires, each having opposite first and second ends, each first end being electrically coupled to testing circuitry in the testing apparatus via the interface apparatus, and each second end being electrically coupled to the first end of a corresponding one of the pogo pin contactors via a corresponding one of the circuit traces.

10. The apparatus of claim 9, wherein the overall height of the adapter is less than or equal to about one inch.

11. The apparatus of claim 9, wherein the pogo pins are pressed into apertures in the floor of the housing with a press fit.

12. The apparatus of claim 9, wherein the adapter further comprises a plurality of fuses, each mounted on the printed circuit board and electrically coupled between the first end of a corresponding one of the contactors and the second end of a corresponding one of the wires of the wire harness.

13. The apparatus of claim 9, wherein the second end of each of the pogo pin contactors has a hemispherical shape.

14. The apparatus of claim 9, wherein the first end of each of the pogo pin contactors extends through an aperture in the printed circuit board.

15. The apparatus of claim 9, wherein the cover of the adapter is held on the housing by fasteners, and wherein the coupling mechanism of the adapter is captivated on the cover.

16. The apparatus of claim 9, wherein the housing, the cover or both the housing and the cover of the adapter are made of a material having a high dielectric strength.

17. The apparatus of claim 9, further comprising:
a first electrical connector having a plurality of electrical contacts, each electrically coupled to the first end of a corresponding one of the wires of the wiring harness of the adapter; and,
a second electrical connector mounted on the testing interface and adapted to mate with the first connector in complementary engagement and to couple electrical signals to and from corresponding ones of the terminal posts, through the testing interface, and to and from the automated testing apparatus.

18. A method for conducting an automated power on testing of an electrical power system of an aircraft, the method comprising:
coupling the adapter of claim 9 to a terminal strip of the aircraft's power system such that the second end of each of the pogo pin contactors is held in biased contact with a corresponding one of the terminal posts;
electrically coupling the first ends of the adapter's wiring harness to a testing interface; and,
electrically coupling the testing interface to an automated power on testing apparatus such that electrical signals are coupled to and from corresponding ones of the terminal posts, through the testing interface, and to and from the automated testing apparatus.

19. A power on testing adapter for making simultaneous electrical contact with a plurality of terminal posts of a terminal strip of an electrical power system of an aircraft, the adapter comprising:

an elongated housing having a cover and a recessed floor, the housing and cover being made of an electrically insulating material having a high dielectric strength;

a plurality of pogo pins protruding through the floor of the housing, each including an electrically conductive contactor having a first end disposed within the recess of the housing, an opposite second end disposed outside of the housing, and a spring biasing the contactor outwardly from the housing;

a printed circuit board having a plurality of electrically conductive traces disposed within the recess of the housing;

a plurality of electrically conductive leads, each coupling the first end of a corresponding one of the pogo pin contactors to a corresponding one of the conductive traces of the printed circuit board;

a wiring harness comprising a plurality of electrically conductive wires, each having opposite first and second ends, each second end being electrically coupled to the first end of a corresponding one of the pogo pin contactors via a corresponding one of the circuit traces of the printed circuit board;

a plurality of fuses, each mounted on the printed circuit board and electrically coupled between the first end of a corresponding one of the contactors and the second end of a corresponding one of the wires of the wire harness;

an electrical connector disposed at a first end of the wiring harness, the connector including a plurality of electrical contacts, each electrically coupled to a first end of a corresponding one of the wires of the wiring harness; and, a mechanism for detachably coupling the housing to the terminal strip such that the second end of each of the pogo pin contactors is held in biased contact with a corresponding one of the terminal posts.

20. The adapter of claim 19, wherein the overall height of the adapter is less than or equal to about one inch.

21. The adapter of claim 19, wherein the pogo pins are pressed into apertures in the floor of the housing with a press fit.

22. The adapter of claim 19, wherein the pogo pins are disposed in line with each other along a single line.

23. The adapter of claim 19, wherein the housing, the cover, or both the housing and the cover are made of phenolic.

24. An adapter for making simultaneous electrical contact with a plurality of terminal posts of a terminal strip, comprising:

a housing;

a plurality of pogo pins protruding through a surface of the housing, each including:
 an electrically conductive contactor having an inner end disposed inside of the housing and an outer end disposed outside thereof; and,
 a spring biasing the contactor outwardly from the housing;

a wiring harness having a plurality of conductive wires, each having a proximal end electrically coupled to the inner end of a corresponding one of the contactors;

a mechanism for detachably coupling the housing to the terminal strip such that the outer end of each of the pogo pin contactors is held in biased contact with a corresponding one of the terminal posts of the terminal strip; and, a plurality of fuses, each electrically coupled between the inner end of a corresponding one of the contactors and the proximal end of a corresponding one of the harness wires.

25. The adapter of claim 24, further comprising:

a printed circuit board disposed within the housing, the printed circuit board including a plurality of electrically conductive traces; and, a plurality of electrically conductive pigtails, each coupling the inner end of a corresponding one of the contactors to a corresponding one of the conductive traces, wherein the proximal end of each of the wires of the wiring harness is electrically coupled to a corresponding one of the conductive traces, and each of the fuses is electrically coupled between a corresponding pair of the conductive traces.

26. The adapter of claim 25, further comprising an electrical connector disposed at a distal end of the wiring harness, the connector including a plurality of electrical contacts, each electrically coupled to a distal end of a corresponding one of the wires of the wiring harness.

* * * * *